(12) United States Patent
Modaffari (10) Patent No.: US 11,658,625 B2
(45) Date of Patent: May 23, 2023

(54) AMPLIFIER CIRCUIT, CORRESPONDING COMPARATOR DEVICE AND METHOD

(71) Applicant: STMicroelectronics S.r.l., Agrate Brianza (IT)

(72) Inventor: Roberto Modaffari, Pallanzeno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 142 days.

(21) Appl. No.: 17/141,812

(22) Filed: Jan. 5, 2021

(65) Prior Publication Data

US 2021/0242846 A1 Aug. 5, 2021

(30) Foreign Application Priority Data

Jan. 31, 2020 (IT) .................. 102020000001906

(51) Int. Cl.
*H03F 3/45* (2006.01)
*H03K 5/24* (2006.01)

(52) U.S. Cl.
CPC ........... *H03F 3/45197* (2013.01); *H03K 5/24* (2013.01); *H03F 2200/375* (2013.01)

(58) Field of Classification Search
CPC ........... H03F 3/45197; H03F 2200/375; H03F 3/45479; H03K 5/24; H03K 5/2481; G01R 19/0038
See application file for complete search history.

(56) References Cited

U.S. PATENT DOCUMENTS 6,750,704 B1 * 6/2004 Connell .............. H03F 3/45753
330/253
2010/0237907 A1 9/2010 Santoro et al.

FOREIGN PATENT DOCUMENTS

CN 105227141 A 1/2016
CN 108494371 A 9/2018

OTHER PUBLICATIONS

Kwon et al., "A 1.2V, 3.5 μW, 20MS/s, 8-bit Comparator with Dynamic-Biasing Preamplifier," IEEE, pp. 4767-4770, 2006.
Mehr et al., "A 55-mW, 10-bit, 40-Msample/s Nyquist-Rate CMOS ADC," *IEEE Journal of Solid-State Circuits* 35(3):318-325, 2000.
Moni et al., "High-Speed and Low-Power Dynamic Latch Comparator," IEEE, 2012, 5 pages.
Srinivas et al., "A Distortion Compensating Flash Analog-to-Digital Conversion Technique," *IEEE Journal of Solid-State Circuits* 47(9):1959-1969, 2006.

* cited by examiner

*Primary Examiner* — Jung Kim
(74) *Attorney, Agent, or Firm* — Seed IP Law Group LLP (57) ABSTRACT

A preamplifier circuit comprises a first pair of transistors and a second pair of transistors having current flow paths therethrough coupled at first and second output nodes and providing first and second current flow lines intermediate a supply node and ground. The two pairs of transistors comprise: first and second input transistors located intermediate the outputs nodes and one of the supply node and ground providing respective input nodes, first and second load transistors intermediate the output nodes and the other of the supply node and ground. The load transistors have control terminals capacitively coupled to the other of the supply node and ground and a reset switch arrangement is provided periodically activatable to short the first output node, the second output node as well as the control terminals of the first load transistor and the second load transistor.

19 Claims, 7 Drawing Sheets

AMPLIFIER CIRCUIT, CORRESPONDING COMPARATOR DEVICE AND METHOD

BACKGROUND

Technical Field

The disclosure relates to (pre)amplifier circuits.

One or more embodiments may be applied, for instance, to dynamic comparators.

Description of the Related Art

Comparator circuits are currently used whenever two electrical quantities (two analog voltages, for instance) are desired to be compared.

In a conventional manner, the result of comparison is returned as a logical value stored using some kind of digital latch.

The circuitry involved may suffer from non-idealities such as noise and mismatch, which may result in a reduced accuracy of the comparison. Such a reduced accuracy may in turn lead to a certain amount of wrong decisions, which can be taken into account during system design, increasing the robustness to these errors, for instance. Improving comparator performance may otherwise lead to an improvement of the efficiency of a system as a whole.

An approach already considered in order to pursue that goal in comparator design may involve one or more (pre) amplifiers introduced before (upstream) a latch in order to reduce the latch offset and input-referred noise generators.

BRIEF SUMMARY

An object of one or more embodiments is to provide improved solutions that provide improved preamplifier behavior, in a comparator circuit, for instance.

According to one or more embodiments, that object can be achieved by a circuit having: a first input transistor having conductive terminals respectively coupled to a first output node and one of a supply node and ground, where the first input transistor has a control terminal coupled to a first input node. The circuit includes a second input transistor having conductive terminals respectively coupled to a second output node and the one of the supply node and ground, where the second input transistor has a control terminal coupled to a second input node. The circuit includes a capacitance having a first side coupled to the other of the supply node and ground and having a second side.

The circuit includes a first load transistor having conductive terminals respectively coupled to the first output node and the other of the supply node and ground, where the first load transistor has a control terminal coupled to the second side of the capacitance. The circuit includes a second load transistor having conductive terminals respectively coupled to the second output node and the other of the supply node and ground, where the second load transistor has a control terminal coupled to the second side of the capacitance. The circuit includes a reset switch circuit configured to, in response to being activated, short the first output node, the second output node, the control terminal of the first load transistor and the control terminal of the second load transistor.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the following description, various specific details are given to provide a thorough understanding of various exemplary embodiments of the present specification. The embodiments may be practiced without one or several specific details, or with other methods, components, materials, etc. In other instances, well-known structures, materials, or operations are not shown or described in detail in order to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

As discussed, an approach already considered in comparator design may involve one or more (pre)amplifiers introduced before (upstream) a latch in order to reduce the latch offset and input-referred noise generators.

Figure 1:
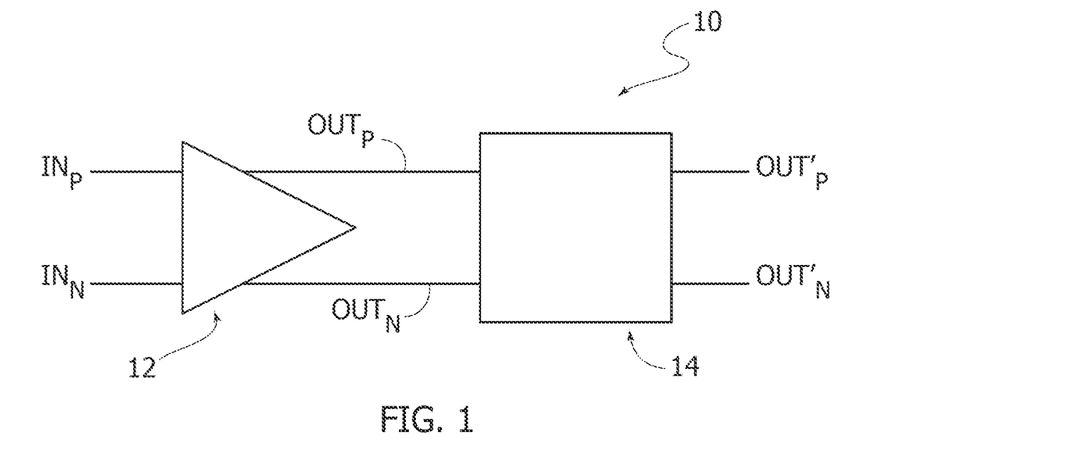
FIG. 1 is a general block diagram of a comparator circuit including a preamplifier.

FIG. 1 is generally exemplary of such an approach in a comparator circuit 10 which comprises a preamplifier 12 having two inputs $IN_P$ and $IN_N$ configured to receive two corresponding (analog) signals—hereinafter a same designation will be used for simplicity for a signal and a circuit element at which that signal may occur—to be compared.

As exemplified in FIG. 1, the preamplifier 12 is configured as a differential amplifier having a differential output with two lines towards a latch circuit 14 having two outputs $OUT_P$ and $OUT_N$ configured to provide therebetween a (differential) output signal $OUT=OUT'_P-OUT'_N$ having a value which is a function of the outcome of comparison, $IN_P>IN_N$ or $IN_P<IN_N$.

The structure of a latch circuit 14 as exemplified herein can be regarded as conventional in the art and known to those of skill in the art, this makes it unnecessary to provide herein a more detailed description of such a latch structure.

One or mere embodiments as discussed herein are primarily concerned with the (pre)amplifier 12.

A typical example of a conventional preamplifier may be based on a classical gin/gin (transconductance) gain stage as discussed, for instance, in I. Mehr and L. Singer: "A 55-mW, 10-bit, 40-Msamples/s Nyquist-Rate CMOS ADC," *IEEE Journal of solid state circuit*, vol. 35, no. 3, March 2000.

Figure 2:
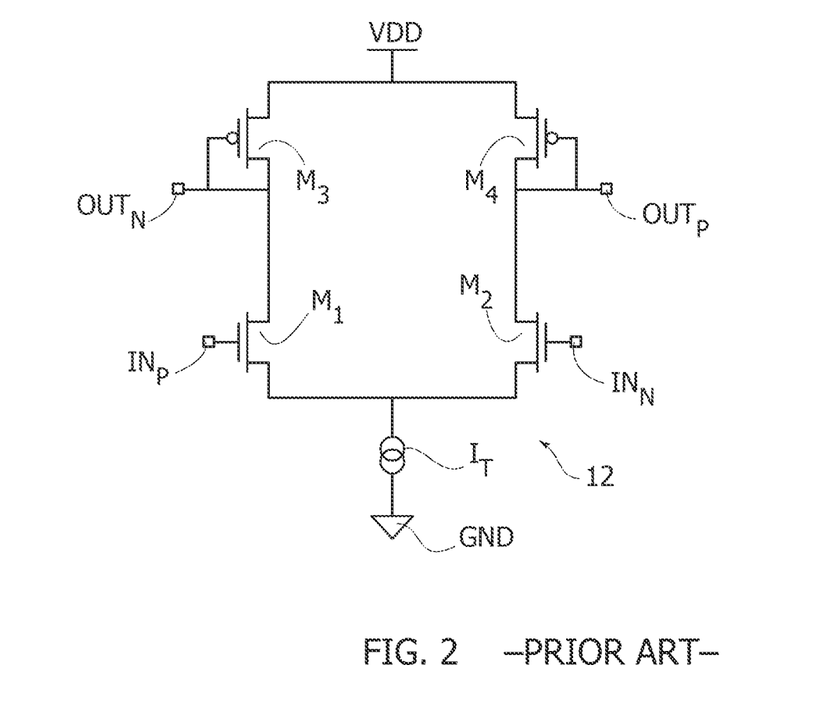
FIGS. 2 and 3 are circuit diagrams of conventional preamplifiers.

As exemplified in FIG. 2, such a gain stage may comprise two current flow lines from a supply node VDD to a common tail current generator $I_T$ referred to ground GND.

Each current line comprises mutually cascaded current flow paths through two transistors (MOSFET transistors, for instance, having source-drain current flow paths therethrough) M1, M3 and M2, M4.

The control terminals (gates, in the case of field-effect transistors such as MOSFET transistors, for instance) of the two transistors M1 and M2 facing the current generator $I_T$ provide the two inputs $IN_P$ and $IN_N$ for the preamplifier stage 12.

The two transistors M3 and M4 towards the supply node VDD are in a diode arrangement, with their control terminals shorted to the current flow paths (that is gates shorted to the source-drain current flow path in the case of field-effect transistors such as MOSFET transistors, for instance) and adapted to provide the two outputs $OUT_P$ and $OUT_N$ to the latch 14 in a comparator device as exemplified in FIG. 1.

An advantage of a circuit as exemplified in FIG. 2 lies in that it does not involve a common-mode feedback. A main drawback may lie in its inherent low gain and in many such stages being possibly involved in those arrangements aiming at reducing input-referred non-idealities in the latch: this may have a negative impact on area, power consumption and speed.

An improved architecture is disclosed in V. Srinivas, S. Pavan, A. Lachhwani, and N. Sasidhar: "A Distortion Compensation Flash Analog-to-Digital Conversion Technique," IEEE Journal of solid state circuit, vol. 41, no. 9, September 2006.

Such an arrangement is exemplified in FIG. 3, where parts or components like parts or components already discussed in connection with the previous figures are indicated with like reference symbols, so that a corresponding description will not be repeated for brevity.

Here again, the transistors M1 and M2 provide a differential input pair configure to receive the input signals $IN_P$ and $IN_N$ to be compared while the transistors M3 and M4 again provide the two outputs $OUT_P$ and $OUT_N$.

Figure 3:
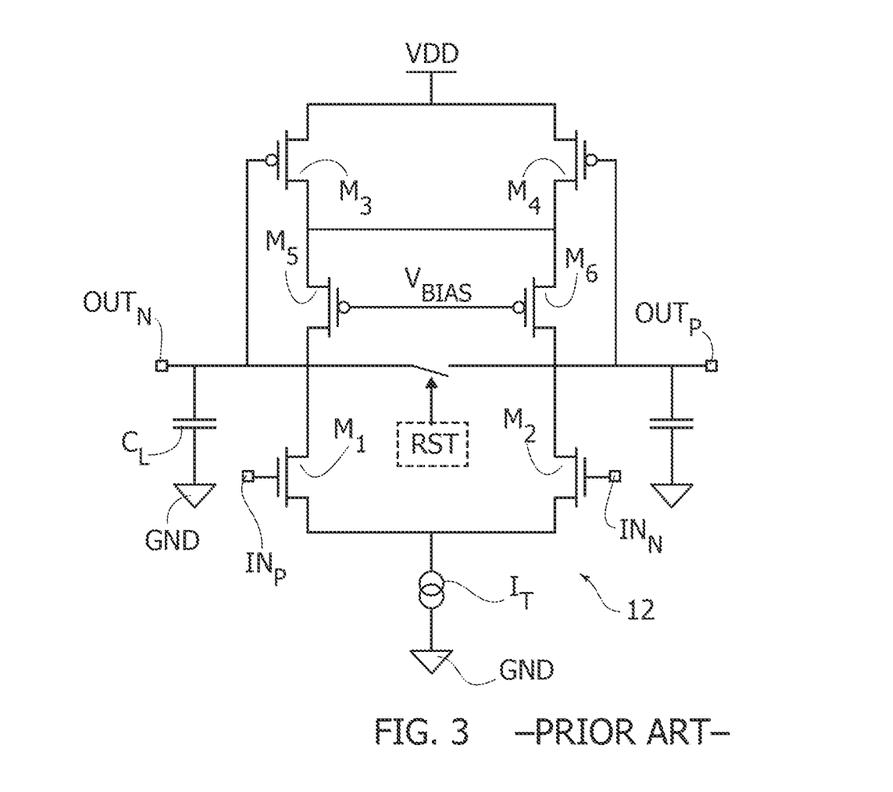

In an arrangement as exemplified in FIG. 3, the transistors M3 and M4:
 are no longer (directly) diode-connected,
 have the current paths therethrough mutually coupled (shorted) at the sides M3 and M4 opposite the supply node VDD, and
 provide a common mode feedback while two further transistors $M_5$ and $M_6$ are arranged with the current flow paths therethrough (source-drain in the case of field-effect transistors such as MOSFET transistors, for instance) in the flow lines from VDD to GND (via $I_T$) intermediate M1, M3 (in the case of M5) and intermediate M2, M4 (in the case of M6), respectively.

In that way, M5 and M6 act as active loads having mutually-coupled control terminals (gates in the case of field-effect transistors such as MOSFET transistors, for instance) kept at a bias voltage $V_{BIAS}$ (provided in a manner known to hose of skill in the art).

In an arrangement as exemplified in FIGS. 3, M3 and M4 provide the two outputs $OUT_P$ and $OUT_N$. For the sake of completeness, FIG. 3 also represents output capacitors $C_L$ coupled between the control terminals (gates, in the case of MOSFET transistors, for instance) of M3 and M4 and ground GND. The capacitors $C_L$ represent parasitic capacitances at the input of the latch circuit 14 as well as parasitic capacitances related to routing, that is the wires coupling the preamplifier 12 with the latch circuit 14.

In an arrangement as exemplified in FIG. 3, the control terminals of M3 and M4 are coupled between M1 and M5 and between M2 and M6 (at the current flow paths therethrough), with a reset switch coupled therebetween, that is between $OUT_P$ and $OUT_N$.

Such a reset switch can be controlled in a manner known to those of skill in the art, for instance by a reset block RST which can be operated in a coordinated manner with the latch circuit 14 as exemplified in the following.

Figure 4:
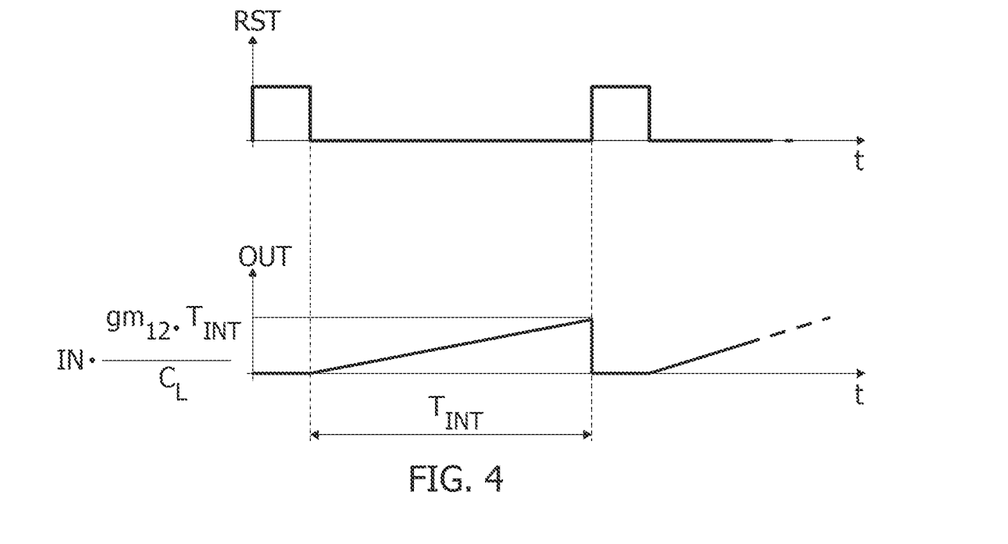
FIG. 4 shows diagrams exemplary of possible operation of a preamplifier circuit as illustrated in FIG. 3.

Assuming that all the transistors illustrated operate in the saturation region, exemplary waveforms for RST ("high"=conductive and "low"=non-conductive) and the differential output OUT (that is $OUT_P-OUT_N$) may be as shown in the diagrams of FIG. 4. These diagrams refer to a common time (abscissa) scale t.

During the reset phase (RST=1, that is with the reset switch controlled by RST made conductive) the nodes $OUT_P$ and $OUT_N$ are shorted to each other and the differential output $OUT=OUT_P-OUT_N$ is zero.

As a result of the reset being released (RST=0, that is with the reset switch controlled by RST made non-conductive) the circuit works as an integrator, with a dynamic gain G limited by the parasitic capacitances $C_L$ at the output nodes:

$$G=OUT/IN=gm_{12} \cdot T_{INT}/C_L$$

where $IN=IN_P-IN_N$ and $OUT=OUT_P-OUT_N$ are the differential input and output, respectively, $gm_{12}$ is the input transconductance, $T_{INT}$ is the integration time separating two reset actions and $C_L$ is the total load capacitance comprising the parasitic capacitance as discussed previously.

The equation above shows that for a given integration time (usually set by the working frequency of the system), reducing the load capacitance may facilitate saving current without losing gain.

It is noted that, from this point of view, the (always connected) gate capacitance of the common-mode-feedback transistors M3 and M4 may represent a source of gain loss, which may be hardly acceptable for (very) low power designs.

It is otherwise noted that another source of extra power consumption may be related to the bias $V_{BIAS}$ of the "active load" transistors M5 and M6 which may involve an additive current branch.

Finally, an arrangement as exemplified in FIG. 3, may entail a trade-off between noise and output swing that cannot be neglected in those cases where noise performance of the preamplifier is an important aspect.

Figure 5:
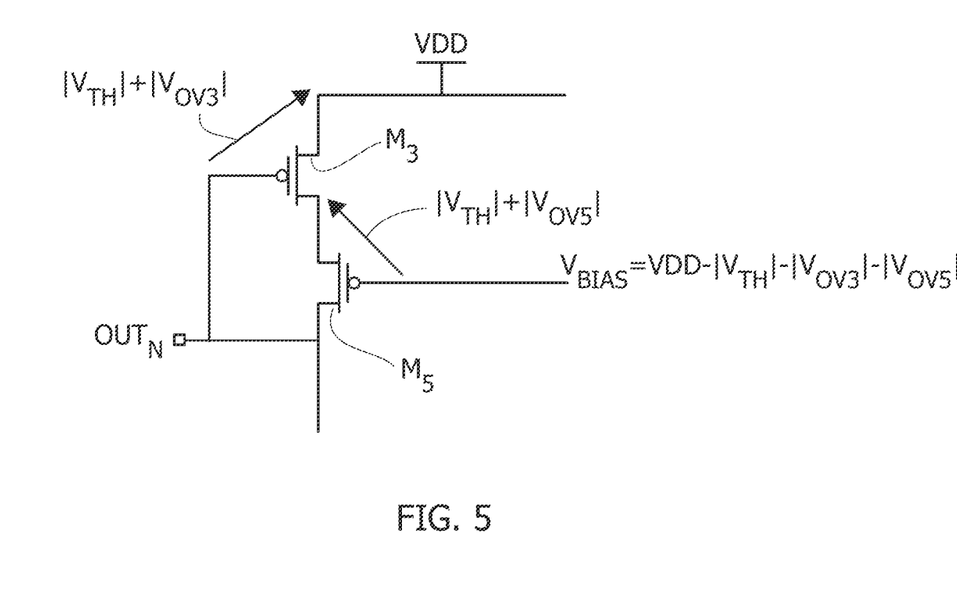
FIG. 5 is exemplary of certain characteristics of a portion of the circuit diagram of FIG. 3.

In that respect one may consider the portion of the circuit of FIG. 3 reproduced in FIG. 5.

The common mode output of that circuit section can be written as:

$$V_{CM}=(OUT_P+OUT_N)/2=VDD-|V_{TH}|-|V_{OV3}|$$

where $|V_{TH}|$ and $|V_{OV3}|$ are the threshold voltage and the overdrive voltage, respectively, of the transistor M3.

The maximum output voltage $V^{MAX}_{OUT}$ that keeps the output generators in saturation can be expressed as:

$$V^{MAX}_{OUT}=VDD-|V_{OV3}|-|V_{OV5}|$$

with an obvious meaning of the terms.

It follows that the maximum output swing $\Delta V_{MAX}$ is:

$$\Delta V_{MAX}=V^{MAX}_{OUT}-V_{CM}=|V_{TH}|-|V_{OV5}|$$

This equation shows that, for a certain threshold voltage (as dictated by technology option), increasing the output swing implies a reduction of the overdrive voltage of the load transistors, which may result in an undesired worsening in terms of the related noise contribution.

Figure 6:
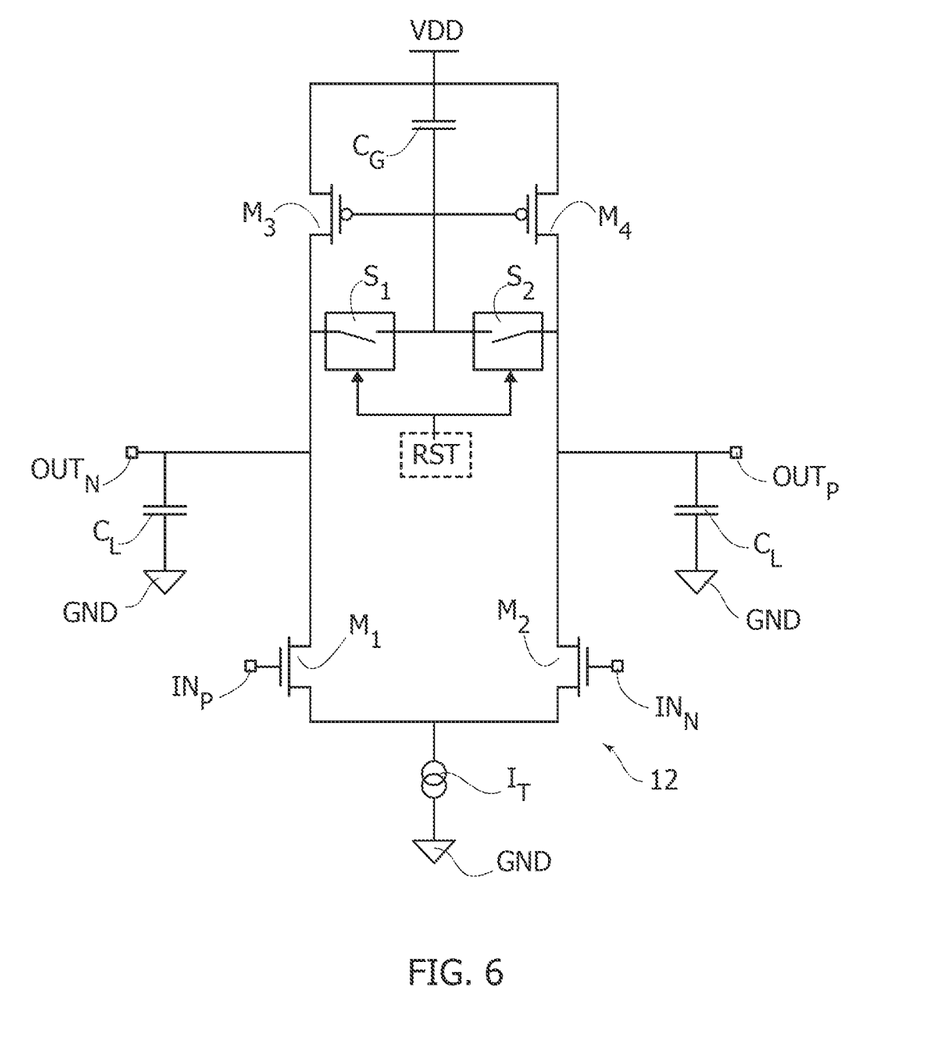
FIG. 6 is a circuit diagram of embodiments described in the instant description.

In one or more embodiments, the drawbacks discussed in the foregoing may be overcome by resorting to a circuit as exemplified in FIG. 6.

Here again, parts or components like parts or components already discussed in connection with the previous figures are indicated with like reference symbols, so that a corresponding description will not be repeated for brevity.

It will be otherwise appreciated that a circuit as exemplified in FIG. 6 (and FIGS. 7A, 7B and 8 as well) is suited for use as a preamplifier 12 in a comparator device 10 as exemplified in FIG. 1.

The basic operating principle of a circuit as exemplified in FIG. 6 is essentially in line with the discussion offered by V. Srinivas, et al.: here again, integrating a current on the load capacitances $C_L$ of the preamplifier stage is contemplated.

By way of direct comparison with the circuit of FIG. 3, in a circuit as exemplified in FIG. 6, the transistor pair M3 and M5 and the transistor pair M4 and M6 of FIG. 3 are "merged" to individual transistors M3 and M4 having their control terminals (gates, in the case of field-effect transistors such as MOSFET transistors, for instance) jointly coupled:

to the supply node VDD via a capacitance $C_G$, and
to the output nodes $OUT_N$ and $OUT_P$ via respective switches S1 and S2 driven by a reset unit RST as discussed previously.

Figure 7A:
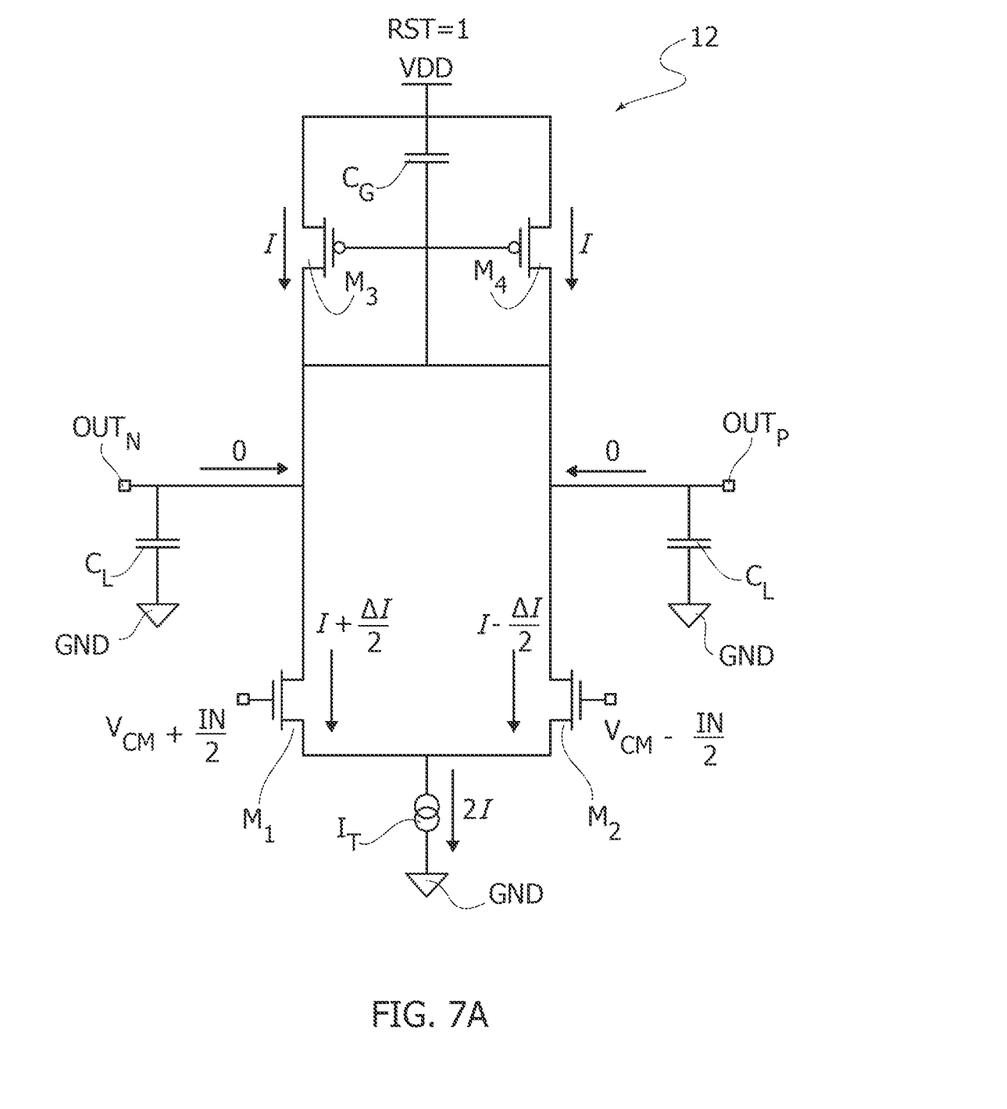
FIGS. 7A and 7B are exemplary of possible operation of embodiments described in the instant description.
Figure 7B:
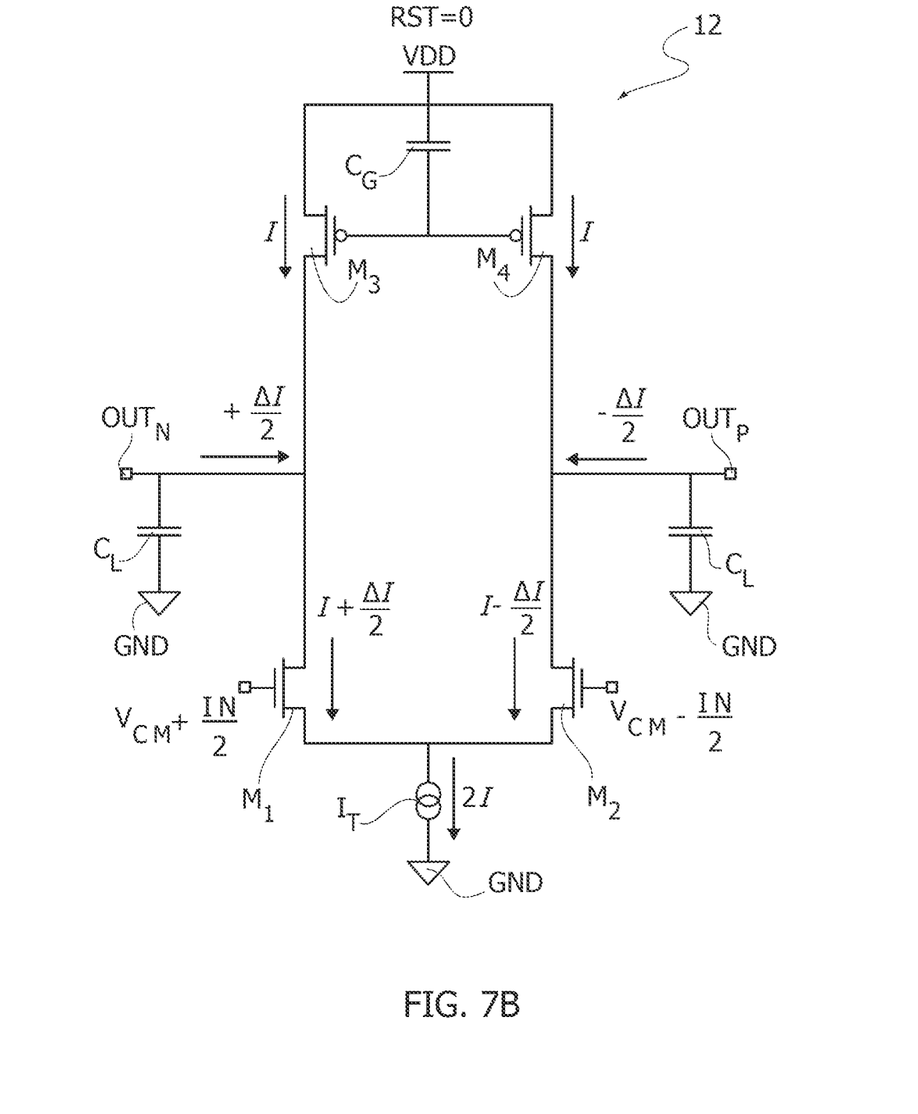

The advantages offered by an arrangement as exemplified in FIG. 6 can be explained by referring to FIGS. 7A and 7B.

FIG. 7A refers to a situation where RST=1, that is a condition where the switches S1 and S2—these can be electronic switches of any known type, such as MOSFETS—are closed, that is, conductive.

FIG. 7B conversely refers to a situation where RST=0, that is a condition where the switches S1 and S2 are open, that is, non-conductive.

In both instances, a DC signal with (differential) amplitude IN=$IN_P$–$IN_N$ is assumed to be present at the preamplifier input.

During the reset phase (RST=1) the reset switches S1 and S2 are closed (conductive) and the two outputs $OUT_P$ and $OUT_N$ are shorted together (and the current through the load capacitances $C_L$ is zero).

In this situation a common mode output is defined by the voltage threshold (gate-source, in the case of field-effect transistors such as a MOSFET transistor) to cause transistor turn-on, that is conductivity, and by the overdrive of the transistors M3 and M4 which provide the common mode feedback of the circuit, as in the case of V. Srinivas, et al., namely:

$$V_{CM} = VDD - |V_{TH}| - |V_{OV3}|.$$

As a result of the reset being released (RST=0), the reset switches S1 and S2 are open (non-conductive), so that the transistors M3 and M4 can play their role as an active load.

They supply a current that depends (only) on their gate voltages. This can be kept constant by their own "gate" capacitance $C_G$ charged at the output-common-mode voltage.

Optionally, an auxiliary capacitance (not visible in the drawing for simplicity) can be connected in parallel with $C_G$ in order to increase the gate voltage stability: that is, $C_G$ can be the gate parasitic capacitance of M3 and M4, possibly increased via a supplemental external component to "strengthen" $V_{GS}$ in M3 and M4.

The differential gain in this condition is the same calculated at the outset of this description and referred to the circuit proposed in V. Srinivas, et al., with the noteworthy difference that now the gate capacitance of the common-mode-feedback no longer contributes to the load capacitance $C_L$, which avoids the related loss of gain and increasing the overall efficiency.

Moreover, no bias for the active load transistors is involved because the related gates can be refreshed at every reset phase when they act as common-mode feedback.

In comparison with the solution presented in V. Srinivas, et al., in an arrangement as exemplified in FIG. 6 the output swing is extended and no longer dependent on the overdrive of the load transistors. In one or more embodiments, output swing is dependent only on the threshold voltage, which may release one or more embodiments from any trade-off between output-swing and active-load noise.

The maximum output voltage that keeps M3 and M4 in the saturation region, in fact, can be written as:

$$V^{MAX}_{OUT} = VDD - |V_{OV3}|$$

which leads to a maximum output swing which may be expressed as:

$$\Delta V_{MAX} = V^{MAX}_{OUT} - V_{CM} = |V_{TH}|$$

which is independent from the MOS overdrive.

Figure 8:
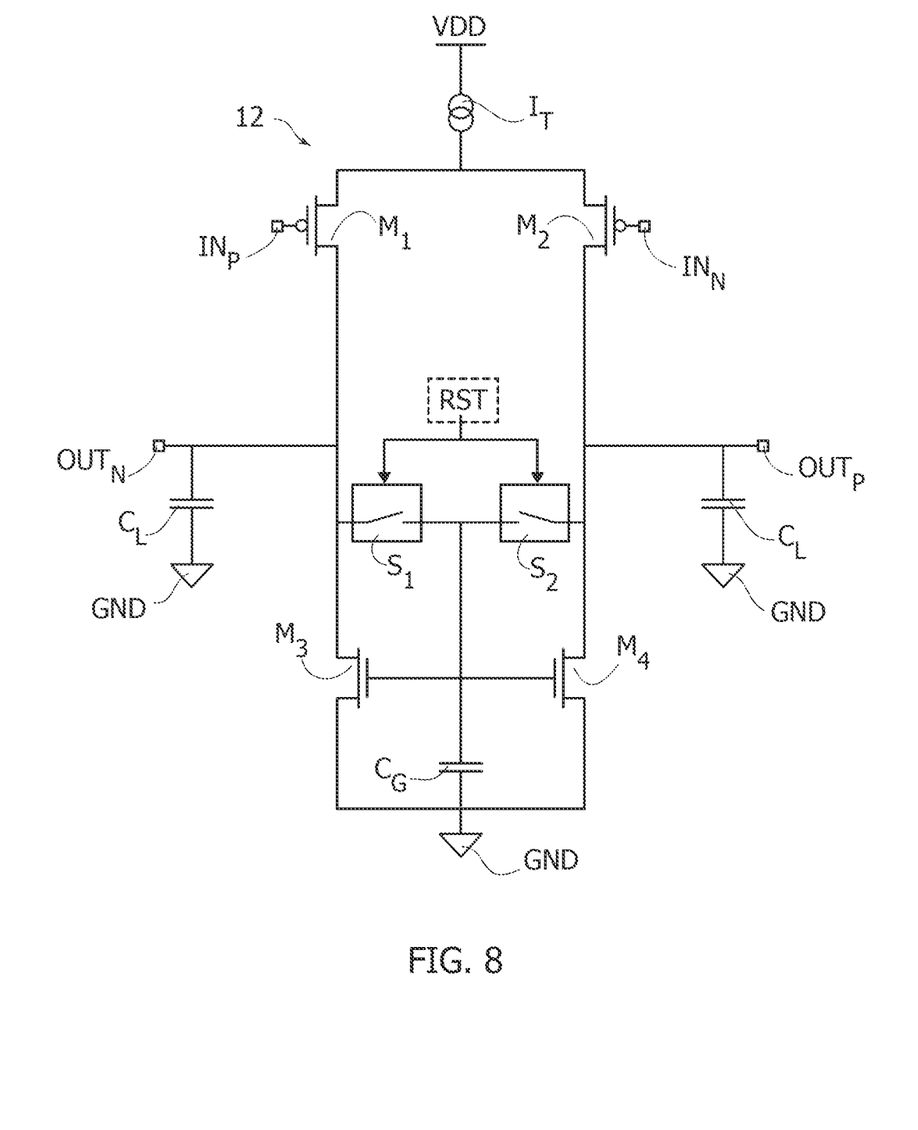
FIG. 8 is a circuit diagram of embodiments as exemplified in FIG. 6 implemented with other component (transistor) types.

The circuit diagram of FIG. 8 is exemplary of the possibility of implementing the same basic principles underlying the circuit diagram of FIG. 6 (with resulting operation as exemplified in FIGS. 7A and 7B) by using PMOS input transistors M1 and M2 (in the place of NMOS input transistors M1 and M2 as exemplified in FIG. 6) and with NMOS load transistors M3 and M4 (in the place of PMOS load transistors M3 and M4 as exemplified in FIG. 6).

Those of skill in the art will easily appreciate that, despite the different transistor types (PMOS v. NMOS) and the upside-down representation adopted for simplicity the circuit topology of FIG. 8 remains otherwise unchanged with respect to FIG. 6, a circuit as exemplified in FIG. 8 being likewise suited for use as a preamplifier 12 in a comparator device 10 as exemplified in FIG. 1.

A (preamplifier) circuit as exemplified herein (for instance, 12) may include: a first pair of transistors (for instance, M1, M3) having current flow paths therethrough (for instance, source-drain in a field-effect transistor such as a MOSFET transistor) coupled at a first output node (for instance, $OUT_N$) and providing a first current flow line intermediate a supply node (for instance, VDD) and ground (for instance, GND), a second pair of transistors (for instance, M2, M4) having current flow paths therethrough (for instance, source-drain in a field-effect transistor such as a MOSFET transistor) coupled at a second output node (for instance, $OUT_P$) and providing a second current flow line intermediate a supply node and ground. Said first pair of transistors and said second pair of transistors comprise: a first input transistor (for instance, M1) in the first pair of transistors, the first input transistor located intermediate said first output node and one (for instance, GND in FIG. 6, resp. VDD in FIG. 8) of said supply node and ground, the first input transistor comprising a control terminal (for instance, gate in a field-effect transistor such as a MOSFET transistor) providing a first input node (for instance, $IN_P$), a second input transistor (for instance, M2) in the second pair of transistors, the second input transistor located intermediate said second output node and said one (for instance, GND in FIG. 6, resp. VDD in FIG. 8) of said supply node and ground, the second input transistor comprising a control terminal providing a second input node (for instance, $IN_N$), a first load transistor (for instance, M3) in the first pair of transistors, the first load transistor located intermediate said first output node and the other (for instance, VDD in FIG. 6 resp. GND in FIG. 8) of said supply node and ground, a second load transistor (for instance, M4) in the second pair of transistors, the second load transistor located intermediate said second output node and said other (for instance, VDD in FIG. 6 resp. GND in FIG. 8) of said supply node and ground, a reset switch arrangement (for instance, semiconductor switches $S_1$, $S_2$) is provided and configured, as a result of being activated (that is, made conductive, for instance, via RST) to short said first output node and said second output node.

Said first load transistor and said second load transistor have control terminals capacitively coupled (for instance, via the capacitance $C_G$, which can comprise the gate parasitic capacitance of M3 and M4, possibly increased via a supplemental external component) to said other of said supply node and ground, said reset switch arrangement is configured, as a result of being activated (that is, made conductive, for instance, via RST), to short (also) the control terminals of said first load transistor and said second load transistor to said first output node and said second output node (shorted to each other).

A circuit as exemplified herein may comprise a current supply source (for instance, a current generator $I_T$) for both said first current flow line through the first pair of transistors (for instance, M1, M3) and said second current flow line through the second pair of transistors (for instance, M2, M4), the current supply source intermediate: one of said supply node and ground, on the one side, and said first current flow line through the first pair of transistors and said second current flow line through the second pair of transistors, on the other side.

In a circuit as exemplified herein, said first input transistor and said second input transistor may be of a first common polarity (for instance, both NMOS as exemplified in FIG. 6 or both PMOS as exemplified in FIG. 8) and said first load transistor and second load transistor may be of a second common polarity (for instance, both PMOS as exemplified in FIG. 6 or both NMOS as exemplified in FIG. 8), opposite said first polarity.

In a circuit as exemplified herein, said first pair of transistors and said second pair of transistors may comprise field-effect transistors, optionally MOSFET transistors.

Consequently, the current flow path therethrough comprises a source-drain current flow path and the control terminal comprises a gate terminal. By way of contrast, in a bipolar transistor the current flow path therethrough comprises a emitter-collector current flow path and the control terminal comprises a base terminal.

A comparator device (for instance, 10) as exemplified herein may comprise a latch circuit (for instance, 14) coupled to said first output node (for instance, $OUT_N$) and said second output node (for instance, $OUT_P$) in a (preamplifier) circuit (for instance, 12) as exemplified herein, wherein said first input node ($IN_P$) and said second input node ($IN_N$) (in the preamplifier circuit) are configured to receive a first input signal and a second input signal for comparison therebetween, the latch circuit having respective output nodes (for instance, $OUT'_N$, $OUT'_P$) and being configured to provide between said respective output nodes a differential latched signal (for instance, $OUT'=OUT'_P - OUT'_N$) having a value which is a function of the outcome (for instance $IN_P > IN_N$ or $IN_P < IN_N$) of the comparison between said first input signal and said second input signal.

A method of operating a circuit (for instance, 12) as exemplified herein or a comparator device (for instance, 10, that is 12 plus 14) as exemplified herein may comprise: applying to said first input node ($IN_P$) and said second input node ($IN_N$) a first input signal and a second input signal for comparison therebetween, collecting (for instance, via a latch circuit such as 14) an output signal (for instance, $OUT_P$, $OUT_N$) between said first output node and said second output node.

A method as exemplified herein may comprise activating (for instance, via RST) at subsequent activation events said switch arrangement (for instance, $S_1$, $S_2$) to short said first output node and said second output node wherein said output signal is zeroed as a result of activation of the switch arrangement.

In a method as exemplified herein, said subsequent activation events of said switch arrangement may be separated by output signal integration intervals (for instance, $T_{INT}$) and wherein the method comprises collecting said output signal between said first and second output nodes at the (final) ends of said integration intervals.

The details and embodiments may vary with respect to what has been disclosed herein and merely by way of example without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
    a first input transistor having conductive terminals respectively coupled to a first output node and one of a supply node and ground, the first input transistor having a control terminal coupled to a first input node;
    a second input transistor having conductive terminals respectively coupled to a second output node and the one of the supply node and ground, the second input transistor having a control terminal coupled to a second input node;
    a capacitance having a first side coupled to the other of the supply node and ground and having a second side;
    a first load transistor having conductive terminals respectively coupled to the first output node and the other of the supply node and ground, the first load transistor having a control terminal coupled to the second side of the capacitance;
    a second load transistor having conductive terminals respectively coupled to the second output node and the other of the supply node and ground, the second load transistor having a control terminal coupled to the second side of the capacitance; and
    a reset switch circuit configured to, in response to being activated, short together all of the first output node, the second output node, the control terminal of the first load transistor and the control terminal of the second load transistor.

2. The circuit of claim 1, comprising:
    a current supply source having an anode and a cathode, wherein one of the anode and the cathode is coupled to one of the supply node and ground, and wherein the other of the anode and the cathode is configured to sink or source both a first current flowing through the first input transistor and the first load transistor and a second current flowing through the second input transistor and the second load transistor.

3. The circuit of claim 1, wherein the first input transistor and the second input transistor have a first polarity in common and the first load transistor and the second load transistor have a second polarity, opposite the first polarity, in common.

4. The circuit of claim 1, wherein the first input transistor, the second input transistor, the first load transistor and the second load transistor are field-effect transistors (FETs).

5. The circuit of claim 4, wherein the first input transistor, the second input transistor, the first load transistor and the second load transistor are metal-oxide-semiconductor FETs (MOSFETs).

6. The circuit of claim 1, wherein the reset switch circuit is configured to, in response to being activated, set the first output node to zero voltage.

7. A comparator, comprising:
a first input transistor having conductive terminals respectively coupled to a first output node and one of a supply node and ground, the first input transistor having a control terminal coupled to a first input node;
a second input transistor having conductive terminals respectively coupled to a second output node and the one of the supply node and ground, the second input transistor having a control terminal coupled to a second input node;
a capacitance having a first side coupled to the other of the supply node and ground and having a second side;
a first load transistor having conductive terminals respectively coupled to the first output node and the other of the supply node and ground, the first load transistor having a control terminal coupled to the second side of the capacitance;
a second load transistor having conductive terminals respectively coupled to the second output node and the other of the supply node and ground, the second load transistor having a control terminal coupled to the second side of the capacitance;
a reset switch circuit configured to, in response to being activated, short together all of the first output node, the second output node, the control terminal of the first load transistor and the control terminal of the second load transistor; and
a latch circuit having input nodes coupled to the first output node and the second output node, respectively, and output nodes, wherein in response to receiving a first input signal at the first input node and a second input signal at the second input node, the latch circuit is configured to provide between the respective output nodes a differential latched signal that based on an outcome of a comparison between the first input signal and the second input signal.

8. The comparator of claim 7, comprising:
a current supply source having an anode and a cathode, wherein one of the anode and the cathode is coupled to one of the supply node and ground, and wherein the other of the anode and the cathode is configured to sink or source both a first current flowing through the first input transistor and the first load transistor and a second current flowing through the second input transistor and the second load transistor.

9. The comparator of claim 7, wherein the first input transistor and the second input transistor have a first polarity in common and the first load transistor and the second load transistor have a second polarity, opposite the first polarity, in common.

10. The comparator of claim 7, wherein the first input transistor, the second input transistor, the first load transistor and the second load transistor are field-effect transistors (FETs).

11. The comparator of claim 10, wherein the first input transistor, the second input transistor, the first load transistor and the second load transistor are metal-oxide-semiconductor FETs (MOSFETs).

12. The comparator of claim 7, wherein the reset switch circuit is configured to, in response to being activated, set the first output node to zero voltage.

13. A method, comprising:
supplying a first input signal to a first input node and a second input signal to a second input node, wherein:
the first input node is coupled to a control terminal of a first input transistor, and the first input transistor has conductive terminals respectively coupled to a first output node and one of a supply node and ground, and
the second input node is coupled to a control terminal of a second input transistor, and the second input transistor has conductive terminals respectively coupled to a second output node and the one of the supply node and ground,
outputting an output signal over a first output node and a second output node, wherein:
the first output node is coupled to a first conductive terminal of a first load transistor, the first load transistor having a second conductive terminal coupled to the other of the supply node and ground and a control terminal coupled to a first side of a capacitance, and the capacitance having a second side coupled to the other of the supply node and ground, and
the second output node is coupled to a first conductive terminal of a second load transistor, the second load transistor having a second conductive terminal coupled to the other of the supply node and ground and a control terminal coupled to the first side of the capacitance, and
activating a reset switch circuit to short together all of the first output node, the second output node, the control terminal of the first load transistor and the control terminal of the second load transistor.

14. The method of claim 13, comprising:
setting the output signal to zero voltage in response to activating, at a subsequent activation event, the reset switch circuit.

15. The method of claim 14, comprising:
separating subsequent activation events of the reset switch circuit by respective output signal integration intervals; and
collecting output signals over the first and second output nodes at respective ends of the output signal integration intervals.

16. The method of claim 13, wherein one of an anode and a cathode of a current supply source is coupled to one of the supply node and ground, and the other of the anode and the cathode of the current supply source sinks or sources both a first current flowing through the first input transistor and the first load transistor and a second current flowing through the second input transistor and the second load transistor.

17. The method of claim 13, wherein the first input transistor and the second input transistor have a first polarity in common and the first load transistor and the second load transistor have a second polarity, opposite the first polarity, in common.

18. The method of claim 13, wherein the first input transistor, the second input transistor, the first load transistor and the second load transistor are field-effect transistors (FETs).

19. The method of claim 18, wherein the first input transistor, the second input transistor, the first load transistor and the second load transistor are metal-oxide-semiconductor FETs (MOSFETs).

* * * * *